(12) United States Patent  
Sherman

(10) Patent No.: US 8,631,613 B1
(45) Date of Patent: Jan. 21, 2014

(54) INTERLOCKING LIPS ON BUILDING INTEGRABLE PHOTOVOLTAIC MODULE EDGES

(75) Inventor: Adam C. Sherman, Newark, CA (US)

(73) Assignee: Miasole, Santa Clara, CA (US)

( * ) Notice: Subject to any disclaimer, the term of this patent is extended or adjusted under 35 U.S.C. 154(b) by 70 days.

(21) Appl. No.: 13/039,706

(22) Filed: Mar. 3, 2011

(51) Int. Cl.
*E04H 14/00* (2006.01)

(52) U.S. Cl.
USPC ........................................................ 52/173.3

(58) Field of Classification Search
USPC ........................................................ 52/173.3
See application file for complete search history.

(56) References Cited

U.S. PATENT DOCUMENTS

| | | | |
|---|---|---|---|
| 2003/0010372 A1* | 1/2003 | Dinwoodie | 136/244 |
| 2004/0000334 A1* | 1/2004 | Ressler | 136/251 |
| 2004/0187909 A1* | 9/2004 | Sato et al. | 136/251 |
| 2008/0053009 A1* | 3/2008 | Plaisted et al. | 52/173.3 |
| 2008/0302030 A1* | 12/2008 | Stancel et al. | 52/173.3 |
| 2009/0019795 A1* | 1/2009 | Szacsvay et al. | 52/173.3 |
| 2011/0005152 A1* | 1/2011 | Plaisted et al. | 52/173.3 |
| 2012/0210660 A1* | 8/2012 | Livsey et al. | 52/173.3 |

* cited by examiner

*Primary Examiner* — Mark Wendell
(74) *Attorney, Agent, or Firm* — Weaver Austin Villeneuve & Sampson LLP

(57) ABSTRACT

Provided are novel building integrable photovoltaic (BIP) modules and methods of installing thereof. A module may include a photovoltaic insert having at least one photovoltaic cell, a channel provided on one edge of the insert, and an extension provided on the opposite edge. The extension is configured to fit snugly into a corresponding channel of an adjacent module during installation. The two modules may have the same design and form a photovoltaic array, which may involve interconnecting with additional modules. The interconnection prevents lifting of one module with respect to another. Therefore, each module needs to be attached to a building structure only along one edge, while the opposite edge is supported by another module. Attachment to the building structure may be in a concealed area of the module, such as a moisture flap, to prevent exposed though holes. This configuration improves moisture sealing properties of the resulting array.

24 Claims, 11 Drawing Sheets

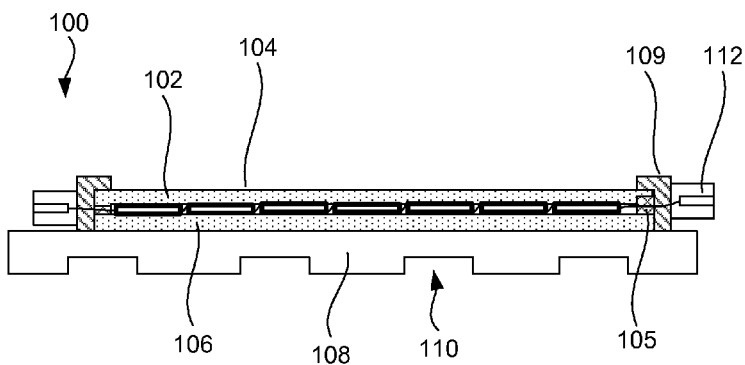
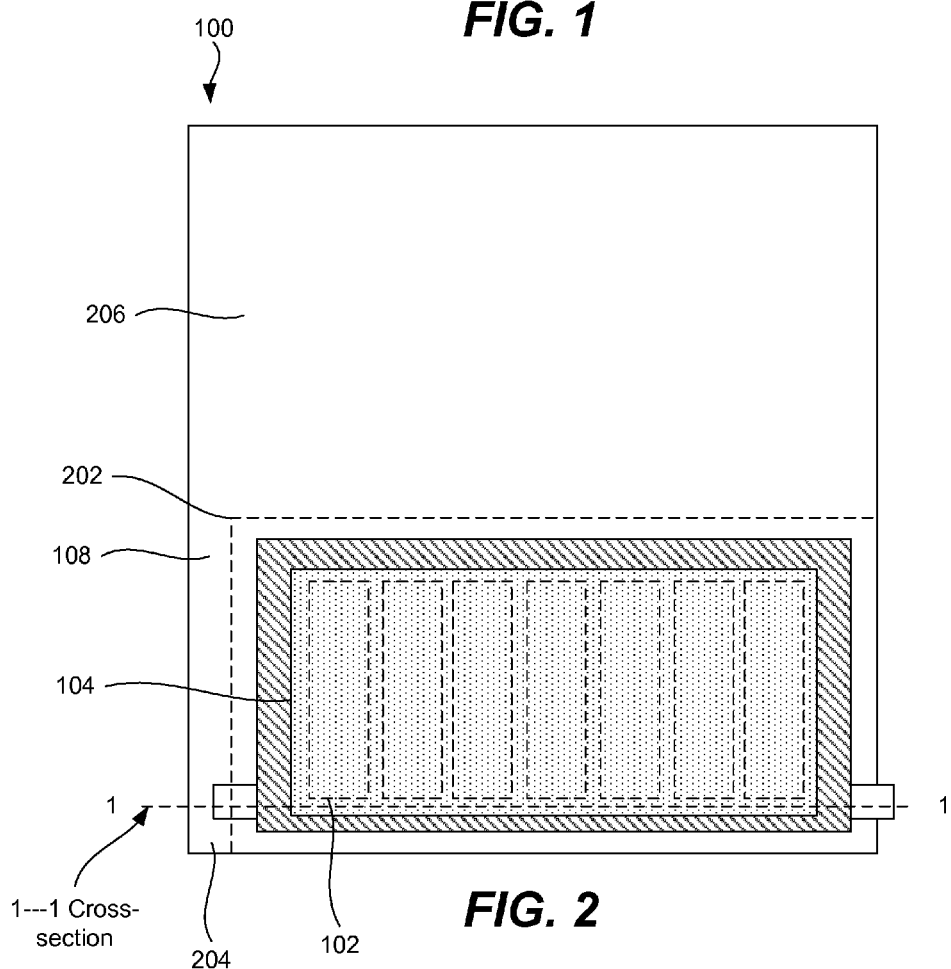

Expanded View

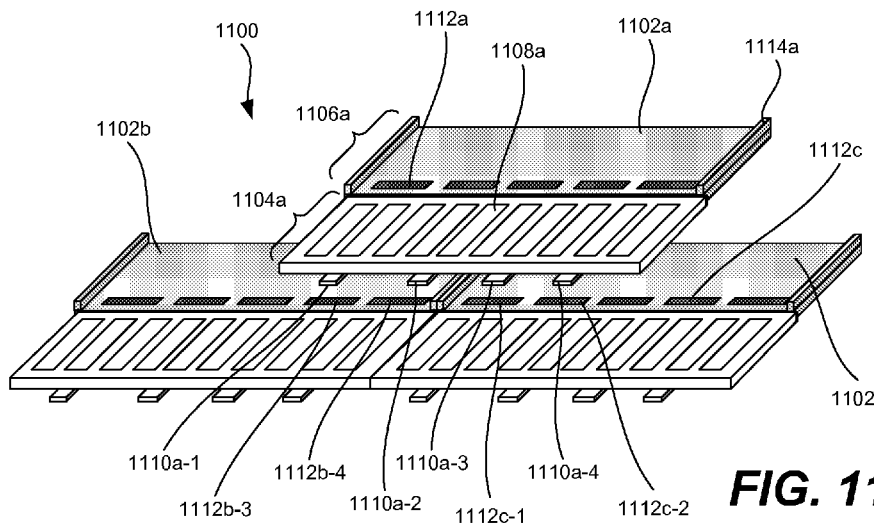
*FIG. 11A*
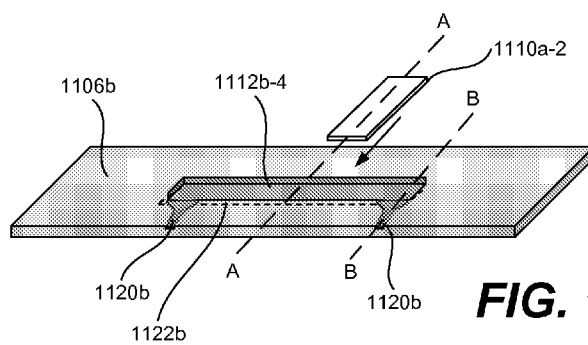
*FIG. 11B*
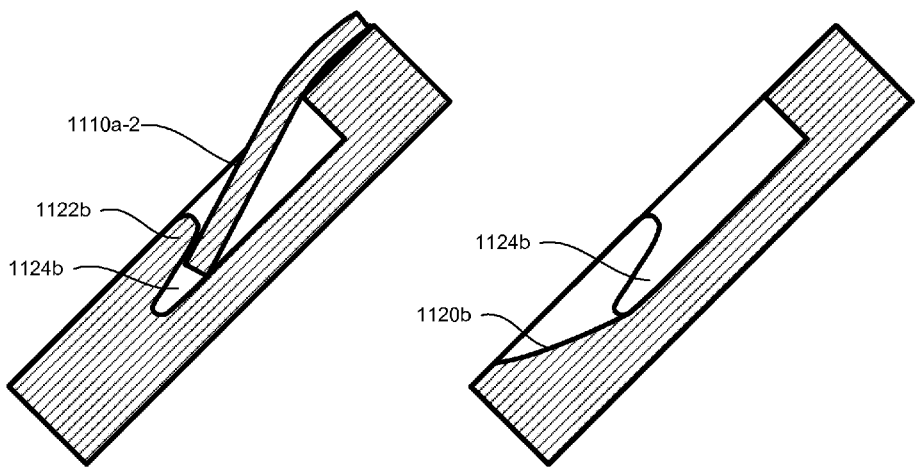
*FIG. 11C*
Cross-Section A-A (after Engagement)
*FIG. 11D*
Cross-Section B-B

INTERLOCKING LIPS ON BUILDING INTEGRABLE PHOTOVOLTAIC MODULE EDGES

BACKGROUND

Photovoltaic cells are widely used for electricity generation with one or more photovoltaic cells typically sealed within and interconnected in a module. Multiple modules may be arranged into photovoltaic arrays used to convert solar energy into electricity by the photovoltaic effect. Arrays can be installed on building rooftops and are used to provide electricity to the buildings and to the general grid.

SUMMARY

Provided are novel building integrable photovoltaic (BIP) modules and methods of installing thereof. A module may include a photovoltaic insert having at least one photovoltaic cell, a channel provided on one edge of the insert, and an extension provided on the opposite edge. The extension is configured to fit snugly into a corresponding channel of an adjacent module during installation. Adjacent modules may have the same design and form a photovoltaic array with additional interconnected modules. In certain embodiments, the modules are configured such that a module is attached to a building structure only along one edge, with an opposite edge supported by another module. This configuration may facilitate installment and stability of the resulting array. Also in certain embodiments, attachment to the building structure is concealed, providing improved moisture protection.

In certain embodiments, a BIP module includes a photovoltaic insert having one or more photovoltaic cells, a first edge, and a second edge opposite of the first edge. The BIP module also includes a channel provided on the first edge and an extension provided on the second edge. The extension is configured to fit snugly into a corresponding channel of an adjacent BIP module during installation. Furthermore, the extension may be configured to prevent lifting of the second edge of module with respect to the rest of the module after the installation. The extension may be also configured to form a moisture tight seal with the corresponding channel of the adjacent module. In certain embodiments, an overlap between the extension and the corresponding channel of the adjacent module is between about 5 millimeters and about 20 millimeters wide.

In certain embodiments, an extension is configured to interlock with a corresponding channel of the adjacent module. Such interlocking may prevent the extension from sliding out of the channel. In the same or other embodiments, a channel of the module includes one or more drain openings to allow water to escape from the channel, in particular, when the module is installed on a sloped surface. In certain embodiments, a module also includes a top protrusion provided on the second edge of the insert, i.e., the edge supporting the extension. The top protrusion of the module is configured to be positioned over a corresponding channel of an adjacent module to prevent water ingress into the corresponding channel.

In certain embodiments, a module also includes a moisture flap provided on the first edge of the insert, i.e., the edge supporting the channel, and configured to extend under yet another adjacent module interconnected with the channel of the module. In these embodiments, the channel may be provided on the moisture flap. In certain embodiments, the channel does not extend to side edges of the moisture flap. The moisture flap may be also configured to prevent water from penetrating in between the two modules. In the same or other embodiments, a module also includes one or more seals positioned inside the channel and/or on an edge of the extension. The module may also include one electrical connector positioned inside the channel and another electrical connector positioned on the extension.

In certain embodiments, the channel is a pocket-channel that does not extend to side edges of the module. The pocket-channel includes one or more drain-openings. In specific embodiments, drain-openings are disposed along the side edges of the pocket-channel. A module may include multiple extensions provided on the second edge of the insert. These multiple extensions may be configured to snugly fit into multiple corresponding channels of at least two adjacent building integrable photovoltaic modules during installation.

Provided also is a method for installing an array of BIP modules on a building structure. The method involves providing a first module including a first photovoltaic insert having one or more first photovoltaic cells and a channel provided on a first edge of the first insert. The method also involves providing a second module including a second photovoltaic insert having one or more second photovoltaic cells and an extension provided on a second edge of the second insert. The method then continues with fitting snugly the extension into the channel. After this fitting, the second edge of the second module can not be lifted up with respect to the first module.

In certain embodiments, the first module may include a moisture flap provided on the first edge. The moisture flap may be attached to the building structure. Some attachment examples include nailing, screwing, gluing, or any other suitable mechanical fastening technique. At least a portion of the second module is positioned over the moisture flap. In the same or other embodiments, snuggly fitting the extension into the channel involves interlocking the two modules. The method may also involve, prior to snuggly fitting the extension into the channel, dispensing a sealing material and/or a bonding material onto the extension of the second module and/or into the channel of the first module. Furthermore, the method may involve attaching a moisture flap of the second module to the building structure. This moisture flap may be provided on an edge opposite of the second edge of the second module. In certain embodiments, attaching this moisture flap of the second module to the building structure is performed after snuggly fitting the extension into the channel of the first module. After attaching the moisture flap to the building structure and after snuggly fitting the extension into the channel, the second module is mechanically secured with respect to the building structure.

In certain embodiments, a method also involves providing a third module including a third photovoltaic insert having one or more third photovoltaic cells and a third extension provided on a third edge of the third photovoltaic insert. The third extension may be then fit snuggly into a channel of the second module. After this fitting, the third extension can not be lifted up with respect to the second module.

These and other aspects of the invention are described further below with reference to the figures.

BRIEF DESCRIPTION OF THE DRAWINGS

FIG. 1 is a schematic cross-sectional side view of a building integrable photovoltaic (BIP) module, in accordance with certain embodiments.

FIG. 2 is a schematic top view of a BIP module, in accordance with certain embodiments.

FIG. 11A is a schematic representation of a photovoltaic assembly including three modules arranged into two rows prior to engaging the module in the top row with the two modules in the bottom row, in accordance with certain embodiments.

FIG. 11B illustrates a schematic expanded view of a tab of one module aligned with respect to a corresponding pocket-channel of another module, in accordance with certain embodiments.

FIG. 11C is a schematic cross-sectional view of the tab inserted into the pocket-channel, in accordance with certain embodiments.

FIG. 11D is a schematic cross-sectional view of the pocket-channel illustrating a profile of the bottom of the drain-opening and a profile of the open cavity, in accordance with certain embodiments.

DETAILED DESCRIPTION OF EXAMPLE EMBODIMENTS

Figure 3:
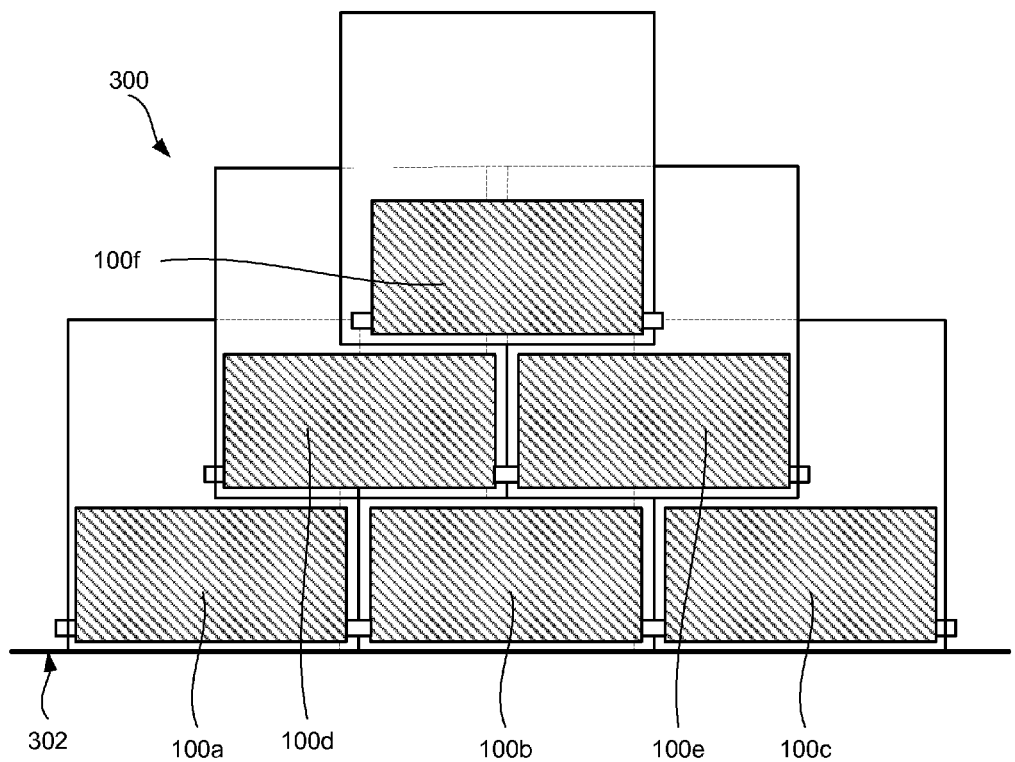
FIG. 3 illustrates a subset of a photovoltaic array that includes six BIP modules, in accordance with certain embodiments.

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Building-integrable photovoltaic (BIP) modules are photovoltaic modules specially configured for integration into various parts of building structures, such as rooftops, skylights, or facades. In certain examples, BIP modules are used to replace conventional building materials such as asphalt shingles. Unlike traditional photovoltaic systems, BIP modules often do not require separate mounting hardware. As such, installed BIP modules provide substantial savings over more traditional systems in terms of building materials and labor costs. For example, a traditional asphalt roof shingle may be completely replaced by a type of BIP module referred to as a "photovoltaic shingle." In certain embodiments, photovoltaic shingle BIP modules are installed on the same base roof structure as asphalt shingles. The BIP modules may have flexible connectors to facilitate installation. A rooftop may be covered completely by photovoltaic shingles or by a combination of the asphalt and photovoltaic shingles. In certain embodiments, BIP modules are shaped like one or a collection of asphalt shingles. In certain embodiments, BIP modules may look and act very much like the asphalt shingles while producing electricity in additional to protecting the underlying building structures from the environment. In certain embodiments, BIP modules may be about 14 (e.g., 13.25) inches by about 40 (e.g., 39.375) inches in size and may be stapled directly to the roof deck through water barrier roofing cloth, for example. Generally, only a portion of the photovoltaic shingle is exposed, while the remaining portion is covered by other shingles. The exposed portion is referred to as the "shingle exposure", while the covered portion is referred to as the "flap." For example, the shingle exposure of a 13.25 inch by 39.375 inch shingle may be only about 5 inches wide or, in some embodiments, about 5.625 inches wide. The length of the shingle exposure in some of these embodiments may be 36 inches or about 39.375 inches (if side skirts are not used, for example). Other dimensions of photovoltaic shingles may be used as well. The total weight of a BIP module may range from about 5 pounds to about 25 pounds, for example about 12 pounds.

During installation of BIP modules on a building structure, the modules are mechanically secured to the building structure. The BIP modules described herein are configured in certain embodiments such that the number of through-holes in the modules is minimized. Conventional building materials are generally much lighter than BIP modules and have much fewer attachment requirements. For example, a traditional asphalt shingle is installed by simply nailing its moisture flap to a building structure. The rest of the shingle, which tends to be very light, is supported on the roof by this only connection with one edge of the shingle left unsecured. BIP modules are generally much heavier and are supported at least along two opposite edges of the photovoltaic insert. In certain embodiments, module designs described herein minimize or eliminate a need for through-holes supporting one edge, which may be an edge opposite of the moisture flap. Another edge, which may be an edge attached to the moisture flap, may be supported by an attachment made in a concealed area, such the moisture flap area, and as a result the through holes made in this area are not exposed.

A module may include a photovoltaic insert having at least one photovoltaic cell, a channel provided on one edge of the insert, and an extension provided on the opposite edge. The extension is configured to fit snugly into a corresponding channel of an adjacent module during installation. The two modules may have the same design and form a photovoltaic array, in certain embodiments with additional interconnected modules. The interconnection prevents lifting of one module with respect to another module. In certain embodiments, each module is attached to a building structure only along one edge, while the opposite edge is supported by another module. Attachment to the building structure may be in a concealed area of the module, such as a moisture flap, to prevent exposed though-holes. This configuration improves moisture sealing properties of the resulting array.

To provide a better understanding of various features of BIP modules and methods of integrating connectors with photovoltaic inserts during module fabrication, some examples of BIP modules will now be briefly described. FIG. 1 is a schematic cross-sectional end view (line 1-1 in FIG. 2 indicates the position of this cross-section) of a BIP module 100 in accordance with certain embodiments. BIP module 100 may have one or more photovoltaic cells 102 that are electrically interconnected. Photovoltaic cells 102 may be interconnected in parallel, in series, or in various combinations of these. Examples of photovoltaic cells include copper indium gallium selenide (CIGS) cells, cadmium-telluride (Cd—Te) cells, amorphous silicon (a-Si) cells, micro-crystalline silicon cells, crystalline silicon (c-Si) cells, gallium arsenide multi-junction cells, light adsorbing dye cells, organic polymer cells, and other types of photovoltaic cells.

Photovoltaic cell 102 has a photovoltaic layer that generates a voltage when exposed to sunlight. In certain embodiments, the photovoltaic layer includes a semiconductor junction. The photovoltaic layer may be positioned adjacent to a back conductive layer, which, in certain embodiments, is a thin layer of molybdenum, niobium, copper, and/or silver. Photovoltaic cell 102 may also include a conductive substrate, such as stainless steel foil, titanium foil, copper foil, aluminum foil, or beryllium foil. Another example includes a conductive oxide or metallic deposition over a polymer film, such as polyimide. In certain embodiments, a substrate has a thickness of between about 2 mils and 50 mils (e.g., about 10 mils), with other thicknesses also within the scope. Photovoltaic cell 102 may also include a top conductive layer. This layer typically includes one or more transparent conductive oxides (TCO), such as zinc oxide, aluminum-doped zinc oxide (AZO), indium tin oxide (ITO), and gallium doped zinc oxide. A typical thickness of a top conductive layer is between about 100 nanometers to 1,000 nanometers (e.g., between about 200 nanometers and 800 nanometers), with other thicknesses within the scope.

In certain embodiments, photovoltaic cells 102 are interconnected using one or more current collectors (not shown). The current collector may be attached and configured to collect electrical currents from the top conductive layer. The current collector may also provide electrical connections to adjacent cells as further described with reference to of FIG. 5, below. The current collector includes a conductive component (e.g., an electrical trace or wire) that contacts the top conductive layer (e.g., a TCO layer). The current collector may further include a top carrier film and/or a bottom carrier film, which may be made from transparent insulating materials to prevent electrical shorts with other elements of the cell and/or module. In certain embodiments, a bus bar is attached directly to the substrate of a photovoltaic cell. A bus bar may also be attached directly to the conductive component of the current collector. For example, a set of photovoltaic cells may be electrically interconnected in series with multiple current collectors (or other interconnecting wires). One bus bar may be connected to a substrate of a cell at one end of this set, while another bus bar may be connected to a current collector at another end.

Photovoltaic cells 102 may be electrically and environmentally insulated between a front light-incident sealing sheet 104 and a back sealing sheet 106. Examples of sealing sheets include glass, polyethylene, polyethylene terephthalate (PET), polypropylene, polybutylene, polybutylene terephthalate (PBT), polyphenylene oxide (PPO), polyphenylene sulfide (PPS) polystyrene, polycarbonates (PC), ethylene-vinyl acetate (EVA), fluoropolymers (e.g., polyvinyl fluoride (PVF), polyvinylidene fluoride (PVDF), ethylene-terafluoethylene (ETFE), fluorinated ethylene-propylene (FEP), perfluoroalkoxy (PFA) and polychlorotrifluoroethane (PCTFE)), acrylics (e.g., poly(methyl methacrylate)), silicones (e.g., silicone polyesters), and/or polyvinyl chloride (PVC), as well as multilayer laminates and co-extrusions of these materials. A typical thickness of a sealing sheet is between about 5 mils and 100 mils or, more specifically, between about 10 mils and 50 mils. In certain embodiments, a back sealing sheet includes a metallized layer to improve water permeability characteristics of the sealing sheet. For example, a metal foil may be positioned in between two insulating layers to form a composite back sealing sheet. In certain embodiments, a module has an encapsulant layer positioned between one or both sealing sheets 104, 106 and photovoltaic cells 102. Examples of encapsulant layer materials include non-olefin thermoplastic polymers or thermal polymer olefin (TPO), such as polyethylene (e.g., a linear low density polyethylene, polypropylene, polybutylene, polyethylene terephthalate (PET), polybutylene terephthalate (PBT), polystyrene, polycarbonates, fluoropolymers, acrylics, ionomers, silicones, and combinations thereof.

BIP module 100 may also include an edge seal 105 that surrounds photovoltaic cells 102. Edge seal 105 may be used to secure front sheet 104 to back sheet 106 and/or to prevent moisture from penetrating in between these two sheets. Edge seal 105 may be made from certain organic or inorganic materials that have low inherent water vapor transmission rates (WVTR), e.g., typically less than 1-2 $g/m^2/day$. In certain embodiments, edge seal 105 is configured to absorb moisture from inside the module in addition to preventing moisture ingression into the module. For example, a butyl-rubber containing moisture getter or desiccant may be added to edge seal 105. In certain embodiments, a portion of edge seal 105 that contacts electrical components (e.g., bus bars) of BIP module 100 is made from a thermally resistant polymeric material. Various examples of thermally resistant materials and RTI ratings are further described below.

BIP module 100 may also have a support sheet 108 attached to back side sealing sheet 106. The attachment may be provided by a support edge 109, which, in certain embodiments, is a part of support sheet 108. Support sheets may be made, for example, from rigid materials. Some examples of rigid materials include polyethylene terephthalate (e.g., RYNITE® available from Du Pont in Wilmington, Del.), polybutylene terephthalate (e.g., CRASTIN® also available from Du Pont), nylon in any of its engineered formulations of Nylon 6 and Nylon 66, polyphenylene sulfide (e.g., RYTON® available from Chevron Phillips in The Woodlands, Tex.), polyamide (e.g., ZYTEL® available from DuPont), polycarbonate (PC), polyester (PE), polypropylene (PP), and polyvinyl chloride (PVC) and weather able engineering thermoplastics such as polyphenylene oxide (PPO), polymethyl methacrylate, polyphenylene (PPE), styrene-acrylonitrile (SAN), polystyrene and blends based on those materials. Furthermore, weatherable thermosetting polymers, such as unsaturated polyester (UP) and epoxy, may be used. The properties of these materials listed above may be enhanced with the addition of fire retardants, color pigments, anti-tracking, and/or ignition resistant materials. In addition, glass or mineral fibers powders and/or spheres may be used to enhance the structural integrity, surface properties, and/or weight reduction. The materials may also include additives such as anti-oxidants, moisture scavengers, blowing or foaming agents, mold release additives, or other plastic additives.

In certain embodiments, support sheet 108 may be attached to back sheet 106 without a separate support edge or other separate supporting element. For example, support sheet 108 and back sheet 106 may be laminated together or support sheet 108 may be formed (e.g., by injection molding) over back sheet 106. In other embodiments back sealing sheet 106 serves as a support sheet. In this case, the same element used to seal photovoltaic cells 102 may be positioned over and contact a roof structure (not shown). Support sheet 108 may have one or more ventilation channels 110 to allow for air to flow between BIP module 100 and a building surface, e.g., a roof-deck or a water resistant underlayment/membrane on top of the roof deck. Ventilation channels 110 may be used for cooling BIP module during its operation. For example, it has been found that each 1° C. of heating from an optimal operating temperature of a typical CIGS cell causes the efficiency loss of about 0.33% to 0.5%.

BIP module 100 has one or more electrical connectors 112 for electrically connecting BIP module 100 to other BIP modules and array components, such as an inverter and/or a battery pack. In certain embodiments, BIP module 100 has two electrical connectors 112 positioned on opposite sides (e.g., the short or minor sides of a rectangular module) of BIP module 100, as for example shown in FIGS. 1 and 2, for example. Each one of two electrical connectors 112 has at least one conductive element electrically connected to photovoltaic cells 102. In certain embodiments, electrical connectors 112 have additional conductive elements, which may or may not be directly connected to photovoltaic cells 102. For example, each of two connectors 112 may have two conductive elements, one of which is electrically connected to photovoltaic cells 102, while the other is electrically connected to a bus bar (not shown) passing through BIP module 100. This and other examples are described in more detail in the context of FIGS. 6 and 7. In general, regardless of the number of connectors 112 attached to BIP module 100, at least two conductive elements of these connectors 112 are electrically connected to photovoltaic cells 102.

FIG. 2 is a schematic top view of BIP module 100 in accordance with certain embodiments. Support sheet 108 is shown to have a side skirt 204 and a top flap 206 extending beyond a BIP module boundary 202. Side skirt 204 is sometimes referred to as a side flap, while top flap 206 is sometimes referred to as a top lap. In certain embodiments, BIP module 100 does not include side flap 204. BIP module boundary 202 is defined as an area of BIP module 100 that does not extend under other BIP modules or similar building materials (e.g., roofing shingles) after installation. BIP module boundary 202 includes photovoltaic cells 102. Generally, it is desirable to maximize the ratio of the exposed area of photovoltaic cells 102 to BIP module boundary 202 in order to maximize the "working area" of BIP module 100. It should be noted that, after installation, flaps of other BIP modules typically extend under BIP module boundary 202. In a similar manner, after installation, side flap 204 of BIP module 100 may extend underneath another BIP module positioned on the left (in the same row) of BIP module 100 creating an overlap for moisture sealing. Top flap 206 may extend underneath one or more BIP modules positioned above BIP module 100. Arrangements of BIP modules in an array will now be described in more detail with reference to FIGS. 3 and 4.

FIG. 3 illustrates a photovoltaic array 300 or, more specifically a portion of a photovoltaic array, which includes six BIP modules 100a-100f arranged in three different rows extending along horizontal rooflines in accordance with certain embodiments. Installation of BIP modules 100a-100f generally starts from a bottom roofline 302 so that the top flaps of BIP modules 100a-100f can be overlapped with another row of BIP modules. If a side flap is used, then the position of the side flap (i.e., a left flap or a right flap) determines which bottom corner should be the starting corner for the installation of the array. For example, if a BIP module has a top flap and a right-side flap, then installation may start from the bottom left corner of the roof or of the photovoltaic array. Another BIP module installed later in the same row and on the right of the initial BIP module will overlap the side flap of the initial BIP module. Furthermore, one or more BIP modules installed in a row above will overlap the top flap of the initial BIP module. This overlap of a BIP module with a flap of another BIP module creates a moisture barrier.

Figure 4:
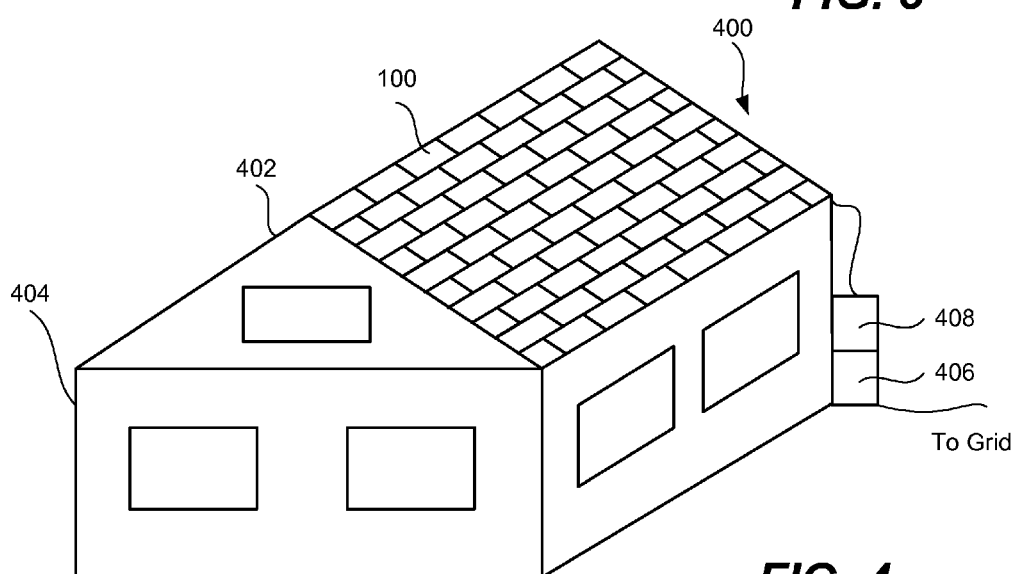
FIG. 4 is a schematic illustration of a photovoltaic array installed on a rooftop of a building structure, in accordance with certain embodiments.

FIG. 4 is a schematic illustration of a photovoltaic array 400 installed on a rooftop 402 of a building structure 404 for protecting building structure 404 from the environment as well as producing electricity in accordance with certain embodiments. Multiple BIP modules 100 are shown to fully cover one side of rooftop 402 (e.g., a south side or the side that receives the most sun). In other embodiments, multiple sides of rooftop 402 are used for a photovoltaic array. Furthermore, some portions of rooftop 402 may be covered with conventional roofing materials (e.g., asphalt shingles). As such, BIP modules 100 may also be used in combination with other roofing materials (e.g., asphalt shingles) and cover only a portion of rooftop. Generally, BIP modules 100 may be used on steep sloped to low slope rooftops. For example, the rooftops may have a slope of at least about 2.5-to-12 or, in many embodiments, at least about 3-to-12.

Multiple BIP modules 100 may be interconnected in series and/or in parallel with each other. For example, photovoltaic array 400 may have sets of BIP modules 100 interconnected in series with each other (i.e., electrical connections among multiple photovoltaic modules within one set), while these sets are interconnected in parallel with each other (i.e., electrical connections among multiple sets in one array). Photovoltaic array 400 may be used to supply electricity to building structure 404 and/or to an electrical grid. In certain embodiments, photovoltaic array 400 includes an inverter 406 and/or a battery pack 408. Inverter 406 is used for converting a direct current (DC) generated by BIP modules 100 into an alternating current (AC). Inverter 406 may be also configured to adjust a voltage provided by BIP modules 100 or sets of BIP modules 100 to a level that can be utilized by building structure 404 or by a power grid. In certain embodiments, inverter 406 is rated up to 600 volts DC input or even up to 1000 volts DC, and/or up to 10 kW power. Examples of inverters include a photovoltaic static inverter (e.g., BWT10240—Gridtec 10, available from Trace Technologies in Livermore, Calif.) and a string inverter (e.g. Sunny Boy®.2500 available from SMA America in Grass Valley, CA). In certain embodiments, BIP modules may include integrated inverters, i.e., "on module" inverters. These inverters may be used in addition to or instead of external inverter 406. Battery pack 408 is used to balance electric power output and consumption.

Figure 5:
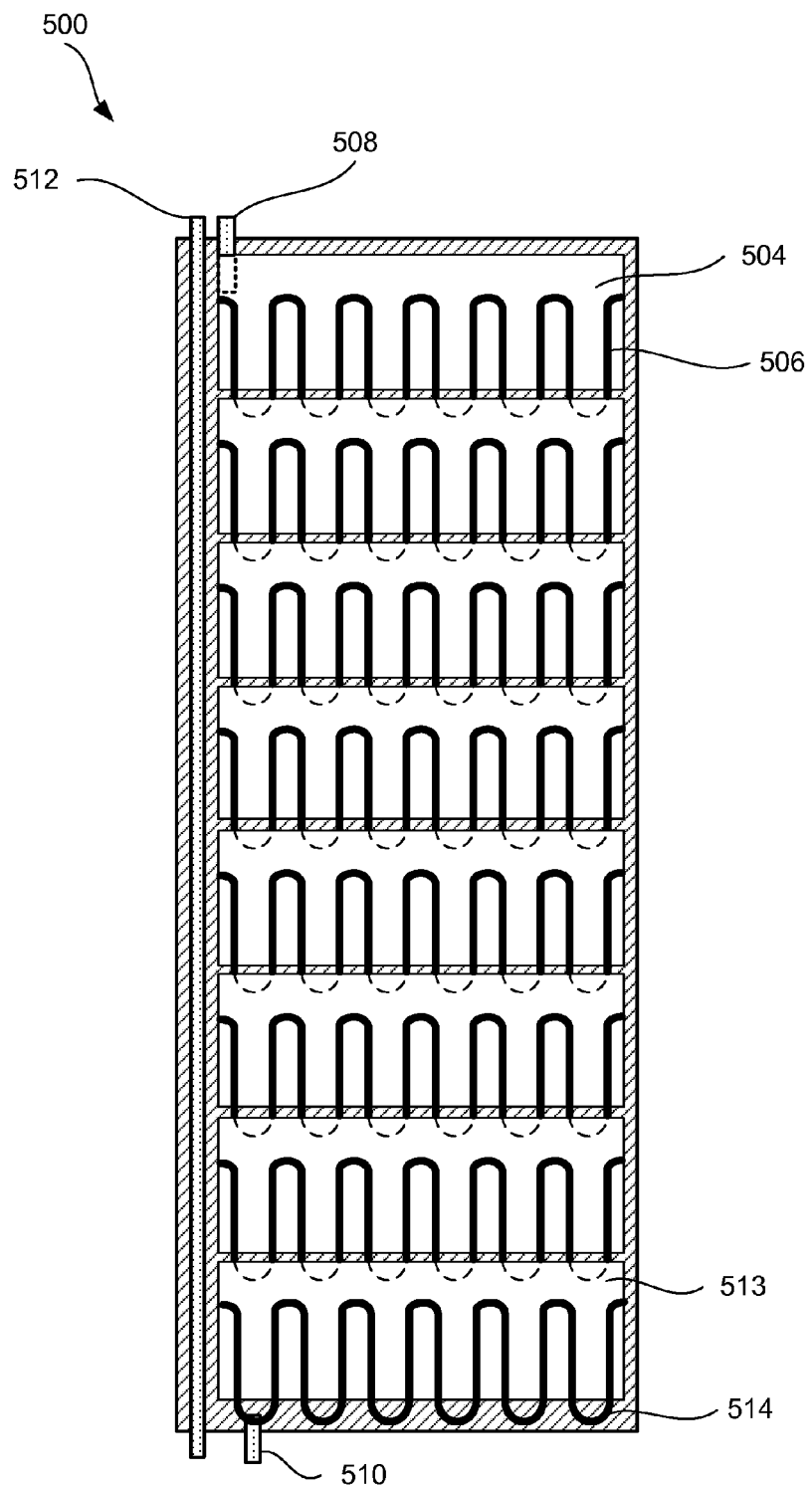
FIG. 5 is a schematic representation of a photovoltaic module having electrically interconnected photovoltaic cells, in accordance with certain embodiments.

FIG. 5 is a schematic representation of a photovoltaic module insert 500 illustrating photovoltaic cells 504 electrically interconnected in series using current collectors/interconnecting wires 506 in accordance with certain embodiments. Often individual cells do not provide an adequate output voltage. For example, a typical voltage output of an individual CIGS cell is only between 0.4V and 0.7V. To increase voltage output, photovoltaic cells 504 may be electrically interconnected in series for example, shown in FIG. 5 and/or include "on module" inverters (not shown). Current collectors/interconnecting wires 506 may also be used to provide uniform current distribution and collection from one or both contact layers.

As shown in FIG. 5, each pair of photovoltaic cells 504 has one interconnecting wire positioned in between the two cells and extending over a front side of one cell and over a back side of the adjacent cell. For example, a top interconnecting wire 506 in FIG. 5 extends over the front light-incident side of cell 504 and under the back side of the adjacent cell. In the figure, the interconnecting wires 506 also collect current from the TCO layer and provide uniform current distribution, and may be referred to herein as current collectors. In other embodiments, separate components are used to for current collection and cell-cell interconnection. End cell 513 has a current collector 514 that is positioned over the light incident side of cell 513 but does not connect to another cell. Current collector 514 connects cell 513 to a bus bar 510. Another bus bar 508 may be connected directly to the substrate of the cell 504 (i.e., the back side of cell 504). In another embodiment, a bus bar may be welded to a wire or other component underlying the substrate. In the configuration shown in FIG. 5, a voltage between bus bars 508 and 510 equals a sum of all cell voltages in insert 500. Another bus bar 512 passes through insert 500 without making direct electrical connections to any photovoltaic cells 504. This bus bar 512 may be used for electrically interconnecting this insert in series without other inserts as further described below with reference to FIG. 6. Similar current collectors/interconnecting wires may be used to interconnect individual cells or set of cells in parallel (not shown).

Figure 6:
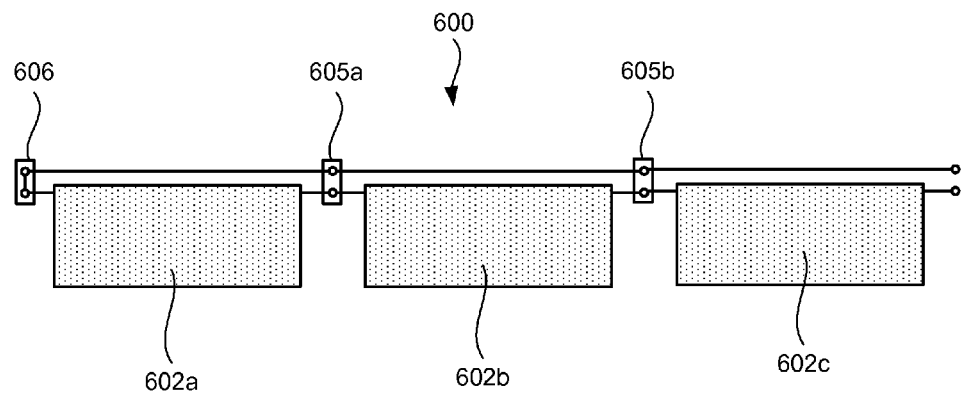
FIG. 6 is a schematic electrical diagram of a photovoltaic array having three BIP modules interconnected in series, in accordance with certain embodiments.

BIP modules themselves may be interconnected in series to increase a voltage of a subset of modules or even an entire array. FIG. 6 illustrates a schematic electrical diagram of a photovoltaic array 600 having three BIP modules 602a-602c interconnected in series using module connectors 605a, 605b, and 606 in accordance with certain embodiments. A voltage output of this three-module array 600 is a sum of the voltage outputs of three modules 602a-602c. Each module connector 605a and 605b shown in FIG. 6 may be a combination of two module connectors of BIP modules 602a-602c. These embodiments are further described with reference to FIGS. 8A-8C. In other words, there may be no separate components electrically interconnecting two adjacent BIP modules, with the connection instead established by engaging two connectors installed on the two respective modules. In other embodiments, separate connector components (i.e., not integrated into or installed on BIP modules) may be used for connecting module connectors of two adjacent modules.

Module connector 606 may be a special separate connector component that is connected to one module only. It may be used to electrically interconnect two or more conductive elements of the same module connector.

Figure 7:
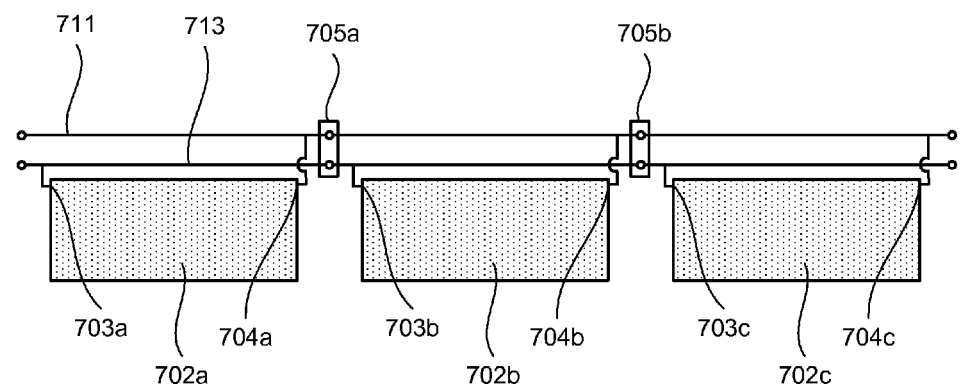
FIG. 7 is a schematic electrical diagram of another photovoltaic array having three BIP modules interconnected in parallel, in accordance with other embodiments.

Sometimes BIP modules may need to be electrically interconnected in parallel. FIG. 7 illustrates a schematic electrical diagram of a photovoltaic array 700 having three BIP modules 702a-702c interconnected in parallel using module connectors 705a and 705b in accordance with certain embodiments. Each module may have two bus bars extending through the module, i.e., a "top" bus bar 711 and a "bottom" bus bar 713 as shown in FIG. 7. Top bus bars 711 of each module are connected to right electrical leads 704a, 704b, and 704c of the modules, while bottom bus bars 713 are connected to left electrical leads 703a, 703b, and 703c. A voltage between the top bus bars 711 and bottom bus bars 713 is therefore the same along the entire row of BIP modules 702a-702c.

Figure 8A:
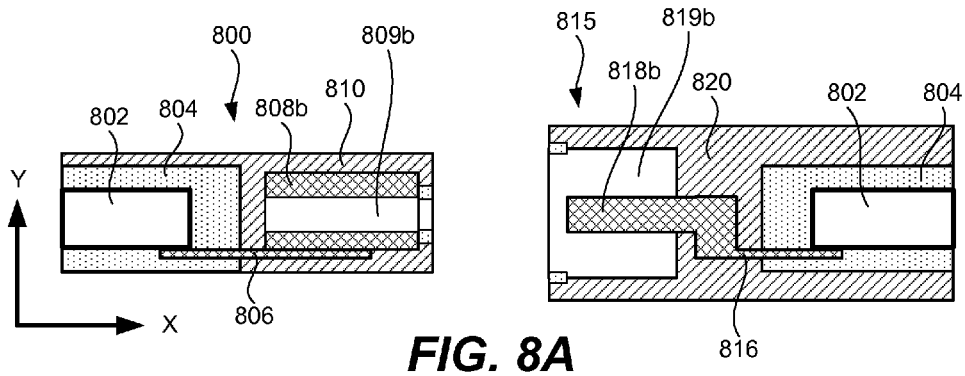
FIGS. 8A-8C are schematic cross-sectional views of two connectors configured for interconnection with each other, in accordance with certain embodiments.

FIG. 8A is a schematic cross-sectional side view of two connectors 800 and 815 configured for interconnection with each other, in accordance with certain embodiments. For simplicity, the two connectors are referred to as a female connector 800 and a male connector 815. Each of the two connectors 800 and 815 is shown attached to its own photovoltaic insert, which includes photovoltaic cells 802 and one or more sealing sheets 804. Connectors 800 and 815 include conductive elements 808b and 818b, respectively, which are shown to be electrically connected to photovoltaic cells 802 using bus bars 806 and 816, respectively.

In certain embodiments, a conductive element of one connector (e.g., conductive element 808b of female connector 800) is shaped like a socket/cavity and configured for receiving and tight fitting a corresponding conductive element of another connector (e.g., conductive element 818b of male connector 815). Specifically, conductive element 808b is shown forming a cavity 809b. This tight fitting and contact in turn establishes an electrical connection between the two conductive elements 808b and 818b. Accordingly, conductive element 818b of male connector 815 may be shaped like a pin (e.g., a round pin or a flat rectangular pin). A socket and/or a pin may have protrusions (not shown) extending towards each other (e.g., spring loaded tabs) to further minimize the electrical contact resistance by increasing the overall contact area. In addition, the contacts may be fluted to increase the likelihood of good electrical contact at multiple points (e.g., the flutes guarantee at least as many hot spot asperities of current flow as there are flutes).

Figure 8B:
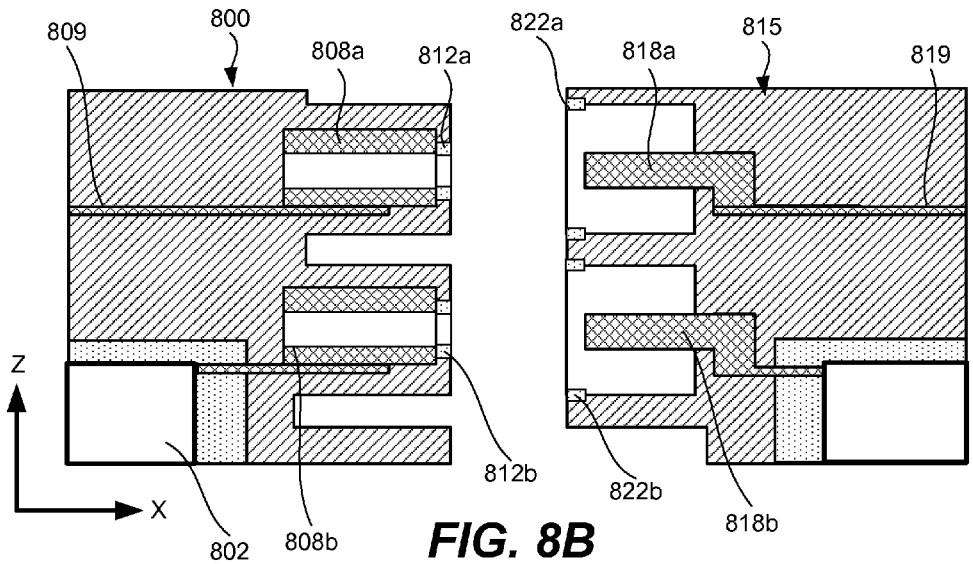
Figure 8C:
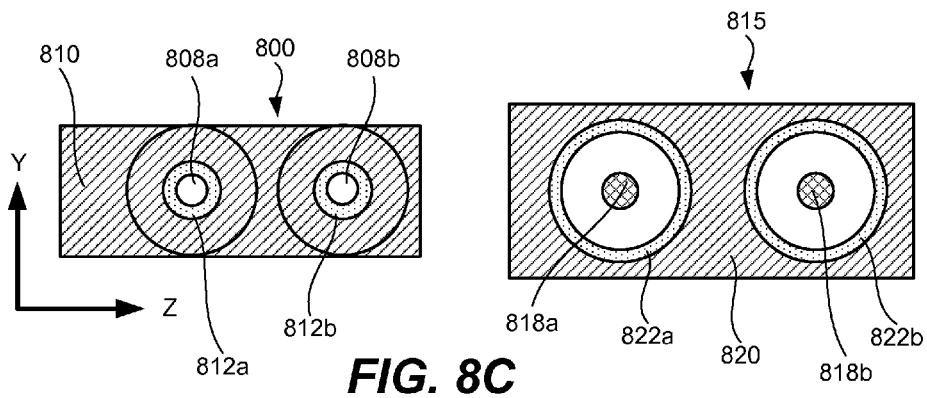

In certain embodiments, connectors do not have a cavity-pin design as shown in FIGS. 8A-8C. Instead, an electrical connection may be established when two substantially flat surfaces contact each other. Conductive elements may be substantially flat or have some topography designed to increase a contact surface over the same projection boundary and/or to increase contact force at least in some areas. Examples of such surface topography features include multiple pin-type or rib-type elevations or recesses.

In certain embodiments, one or more connectors attached to a BIP module have a "touch free" design, which means that an installer can not accidently touch conductive elements or any other electrical elements of these connectors during handling of the BIP module. For example, conductive elements may be positioned inside relatively narrow cavities. The openings of these cavities are too small for a finger to accidently come in to contact with the conductive elements inside the cavities. One such example is shown in FIG. 8A where male connector 815 has a cavity 819b formed by connector body 820 around its conductive pin 818b. While cavity 819b may be sufficiently small to ensure a "touch free" designed as explained above, it is still large enough to accommodate a portion of connector body 810 of female connector 800. In certain embodiments, connector bodies 810 and 820 have interlocking features (not shown) that are configured to keep the two connectors 800 and 815 connected and prevent connector body 810 from sliding outs of cavity 819b. Examples of interlocking features include latches, threads, and various recess-protrusion combinations.

FIG. 8B is schematic plan view of female connector 800 and male connector 815, in accordance with certain embodiments. Each connector 800, 815 is shown with two conductive elements (i.e., conductive sockets 808a and 808b in connector 800 and conductive pins 818a and 818b in connector 815). One conductive element (e.g., socket 808b and pin 818b) of each connector is shown to be electrically connected to photovoltaic cells 802. Another conductive element of each connector 800, 815 may be connected to bus bars (e.g., bus bars 809 and 819) that do not have an immediate electrical connection to photovoltaic cells 802 of their respective BIP module (the extended electrical connection may exist by virtue of a complete electrical circuit).

As shown, sockets 808a and 808b may have their own designated inner seals 812a and 812b. Inner seals 812a and 812b are designed to provide more immediate protection to conductive elements 808a and 818a after connecting the two connectors 800, 815. As such, inner seals 812a and 812b are positioned near inner cavities of sockets 808a and 808b. The profile and dimensions of pins 818a and 818b closely correspond to that of inner seals 812a and 812b. In the same or other embodiments, connectors 800, 815 have external seals 822a and 822b. External seals 822a and 822b may be used in addition to or instead of inner seals 812a and 812b. Various examples of seal materials and fabrication methods are described below in the context of FIG. 9. FIG. 8C is schematic front view of female connector 800 and male connector 815, in accordance with certain embodiments. Connector pins 818a and 818b are shown to have round profiles. However, other profiles (e.g., square, rectangular) may also be used for pins 818a and 818b and conductive element cavities 808a and 808b.

Figure 9:
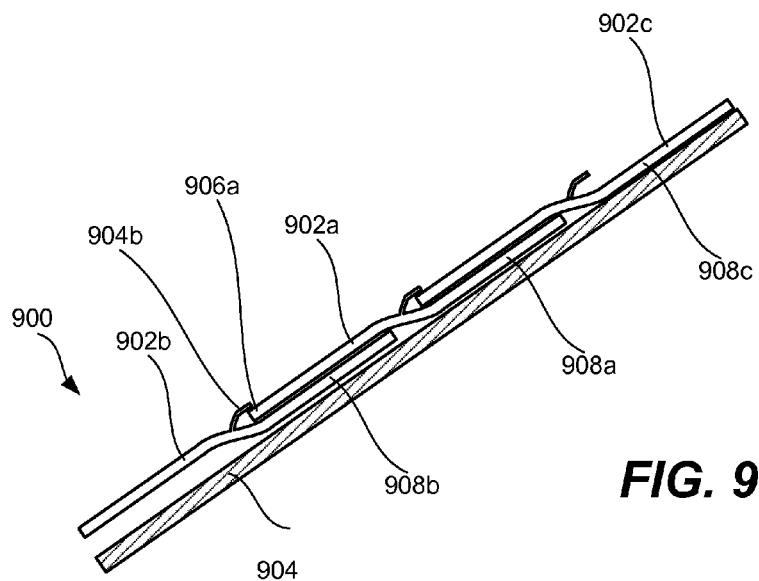
FIG. 9 is a schematic representation of a BIP array including three BIP modules, in accordance with certain embodiments.

FIG. 9 is a schematic representation of a BIP array 900 including three BIP modules 902a, 902b, and 902c in accordance with certain embodiments. BIP array 900 is shown positioned on a sloped building structure 904. In other embodiments, BIP modules 902a, 902b, and 902c may be positioned on a substantially horizontal building structure. BIP modules 902a, 902b, and 902c may be attached to building structure 904 at their respective moisture flaps 908a, 908b, and 908c. For example, moisture flaps 908a, 908b, and 908c may be nailed, screwed, glued, or otherwise mechanically attached to building structure 904. Each of moisture flaps 908a, 908b, and 908c extends under at least a portion of an adjacent module to enhance a moisture seal. In certain embodiments, a moisture flap extends under at least about 50% of the module's width (i.e., the module's dimension extending along the roof slope) of the module positioned in the upper adjacent row. This degree of the overlap is needed to ensure that any gap that may exist in between each pair of the modules in one row fully overlaps with a moisture flap of the module in the lower adjacent row. For example, the moisture flap may be at least about two inches wider than the corresponding photovoltaic portion, which remains exposed after installation. In certain embodiments, the module may also include one or more side flaps. These flaps extend in a direction perpendicular to the moisture flap and are attached to side edges of the module. When at least one side flap is present, then the moisture flap may be narrows and extend under only a part of the photovoltaic portion. As shown in FIG. 9, moisture flap 908a extends under a portion of module 902c, while moisture flap 908b extends under a portion of module 902a. A puncture hole through a moisture flap of a BIP module to attach it to a building structure underlies an adjacent module and generally does not cause moisture sealing problems.

Attachment of a moisture flap of a module to a building structure provides support to an edge of the insert attached to the flap with respect to the building structure. A channel or an extension may be provided along that edge and may be similarly supported with respect to the building structure. For example, moisture flap 908b is provided on the same edge of module 902b as channel 904b. Attaching moisture flap 908b to building structure 904 will also provide support to channel 904b. At the same time, this attachment does not expose any through-holes that may be needed for the attachment because moisture flap 908b is fully covered by a portion of module 902a.

An edge of the module opposite of the moisture flap may be supported by an adjacent module without a need to make a direct connection between the module and building structure. More specifically, two adjacent modules may interconnect to support an edge of one module. In certain embodiments, one module has an extension provided on its edge while another module has a channel configured for snugly fitting around the extension of the first module. FIG. 9 illustrates an extension 906a of module 902a inserted into channel 904b of module 902b. Channel 904b prevents extension 906a from lifting with respect to at least module 902b.

In certain embodiments, a BIP module has a channel provided on one edge of the photovoltaic insert and an extension provided on the opposite edge of the insert. A combination of an insert, channel, extension, moisture flap, electrical connectors is referred to as a module. Various examples of photovoltaic inserts and connectors are described above. The extension is configured to fit snugly into a corresponding channel of an adjacent module during installation. The extension is also configured to prevent lifting of the edge supporting the extension with respect to the adjacent module after the installation. The adjacent module and other modules in a photovoltaic array may have similar extension-channel designs.

In certain embodiments, two interconnected modules may be offset with respect to each other. For example, a channel extending throughout the entire edge of one module may be interconnected only with a portion of the extension that also extends throughout the entire edge of the other module. The channel and extension only partially overlap. The rest of the channel may be interconnected with another extension of a third module and so on. One such example is further described below in the context of FIG. 10B.

Figure 10A:
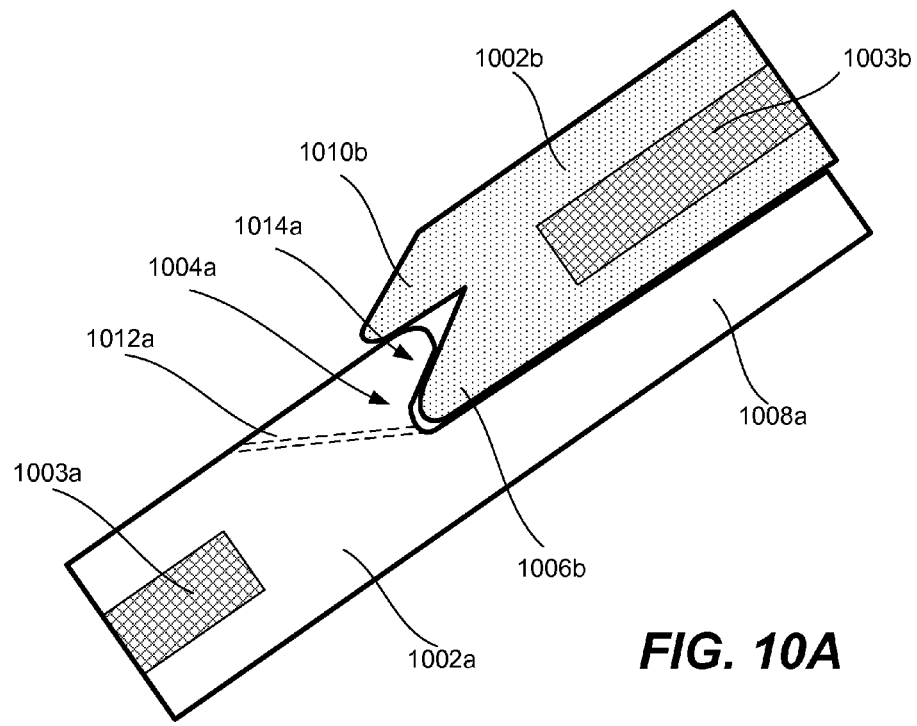
FIG. 10A is a schematic representation of an interconnection between a channel of one BIP module with an extension of another BIP module, in accordance with certain embodiments.

FIG. 10A is a schematic representation of an interconnection of a channel 1004a of one BIP module 1002a with an extension 1006b of another BIP module 1002b in accordance with certain embodiments. While various features are discussed in the context of only portions of modules 1002a and 1002b, one having ordinary skill in the art would understand that the corresponding features may be present on other ends of modules 1002a and 1002b as generally shown in FIG. 9. BIP modules 1002a and 1002b include one or more photovoltaic cells 1003a and 1003b respectively.

Extension 1006b is shown snugly fit into channel 1004a. In certain embodiments, extension 1006b is configured to form a moisture tight seal with channel 1004a such that water from rain or other precipitation can not penetrate through the seal. In the same or other embodiments, module 1002a also include a moisture flap 1008a provided on the same edge as channel 1004a. Moisture flap 1008a is configured to extend under at least a portion of adjacent module 1002b. It also prevents water from penetrating in between the two modules and may be used for attachment to a building structure as described above. In certain embodiments, an overlap between extension 1006b and channel 1004a is between about 5 millimeters and about 20 millimeters.

Module 1002a may have one or more flow channels 1012a that can be used to drain water from channel 1004a as well as for other purposes. For example, if a module is installed on a sloped surface as shown in FIGS. 9 and 10, water may flow out of channel 1004a under its own gravity using one or more flow channels 1012a. Flow channels 1012a may also be used for accessing extension 1006b during installation and repair while module 1002a is interconnected with module 1002b. For example, an interlocking mechanism may be positioned around a flow channel and may be accessed through a flow channel when the two modules need to be separated. Flow channels 1012a may have closed or open channel structures and extend toward the front surface of the module. An example of the closed channel structure is shown in FIG. 10A. In another example, flow channels may be or include a set of cuts in a top lip 1014a (that partially defines channel 1004a) forming open channel structures. Flow channels 1012a generally do not extend over photovoltaic cells 1003a to prevent interference with light.

Figures 10B, 10C:
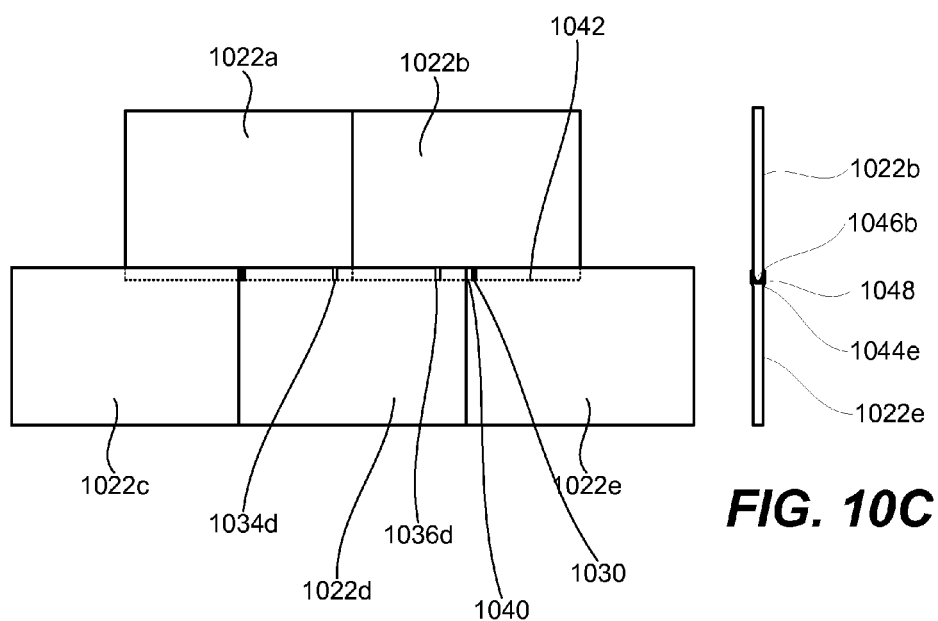
FIG. 10B is a schematic top view of five BIP modules forming two interconnected rows, in accordance with certain embodiments.
FIG. 10C is a schematic side view of BIP modules forming two interconnected rows, in accordance with certain embodiments.

FIG. 10B is a schematic top view of five BIP modules 1022a-1022e forming two interconnected rows in accordance with certain embodiments. Specifically, modules 1022a and 1022b form a top row (or portion thereof), while modules 1022c, 1022d, and 1022e form a bottom row (or portion thereof). Modules in one row are interconnected with modules in another row using a combination of a channel and an extension. This configuration is illustrated in FIG. 10C in more detail showing two BIP modules 1022b and 1022c. An extension 1046b of module 1022b is inserted into a channel 1044e of module 1022e. The tip of extension 1046b may touch the bottom of channel 1044e forming an interface line 1048. The same interface is shown with a dotted line 1042 in FIG. 10B. In certain embodiments, this interface may have some spacing that is used for draining water out of the channel. An interface does not necessarily require touching between the channel and extension components in a particular location. In general, an interface may be provided by a seal or other modules' components and/or be positioned in locations other than the bottom of the channel.

As shown in FIG. 10B, modules in one row may be offset with respect to modules in another row. The offset results in one module connected to two other modules in an adjacent row. For example, an extension of module 1022b is inserted a channel of module 1022e and a channel of module 1022d. In a similar manner, the channel of module 1022d receives extensions of modules 1022a and 1022b. This offset may help to improve moisture sealing and/or mechanical integrity characteristics of the entire array.

Water may be drained from the interface between two rows using flow channels, which are described above in the context of FIG. 10A. FIG. 10B illustrates two flow channels 1034d and 1036d, which may be open channels formed by cut outs in the top lip of the channel. Draining may be also achieved by providing side openings, such as one at an interface 1040 located at the junction of modules 1022d and 1022e. Such a side opening at interface 1040 may be used to drain water from any spacing between any of the modules. In certain embodiments, a plug 1030 is disposed to prevent water flowing within the spacing past this plug. A plug may be needed to prevent water from flowing behind the modules and toward the building structure if, for example, multiple channels are not interconnected to form a continuous sealed channel. Plug 1030 may be a part of module 1022d, e.g., a protrusion in its channel, or a part of module 1022b, e.g., a protrusion on the extension. Plug 1030 or similar features may be also used to reference one module with respect to another.

In certain embodiments, module 1002b also includes a top protrusion 1010b provided on the same edge of module as extension 1006b. Top protrusion 1010b is configured extend over channel 1004a of adjacent module 1002a and may be used to further enhance a moisture seal and/or mechanical interconnection between modules 1002a and 1002b. Top protrusion 1010b may be made from flexible material and exert a downward pressure on channel 1004a in the installed position to ensure sealing.

Figure 10D:
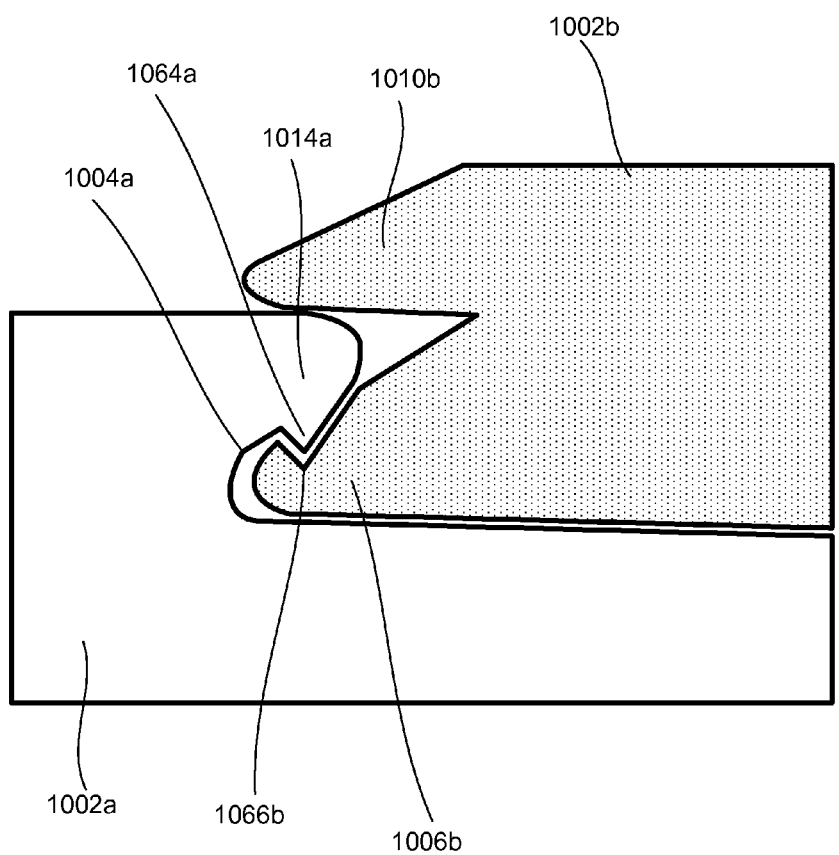
FIG. 10D illustrates a set of interlocking features, in accordance with certain embodiments.

In certain embodiments, an extension is configured to interlock with a channel of an adjacent module. For example, the channel and extension may have corresponding protrusions extending towards each other during the installation and allowing the extension to be inserted into the channel but not slid out of the channel. FIG. 10D illustrates a set of interlocking features 1064a and 1066b in accordance with certain embodiments. Specifically, interlocking feature 1064a is an extension positioned on top lip 1014a that forms channel 1004a. Interlocking feature 1066b is a recess in extension 1006b. When extension 1006b is inserted into channel 1004a, top lip 1014a slightly flexes upwards allowing features 1064a and 1066b to interlock. Once engaged, interlocking features 1064a and 1066b prevent extension 1006b from sliding out of channel 1004a. Interlocking features may be also positioned on a top flap, a moisture flap, and/or other components of the module. Furthermore, interlocking features may be also used to prevent two modules from sliding in a direction parallel to the extension or the channel, in which case a locking surface formed by a protrusion and extension should extend in a direction perpendicular to the channel length. As further explained below with reference to FIGS. 11A-11D, in certain embodiments, interlocking along this direction may be accomplished by a series of pocket-channel and individual tab combinations.

In certain embodiments, a module also includes one or more seals positioned inside the channel and/or on an edge of the extension. A seal may be installed during fabrication of the module or during its installation. For example, a sealing material and/or bonding material may be dispensed onto an extension and/or into a channel prior to interconnecting the two.

Figure 10E:
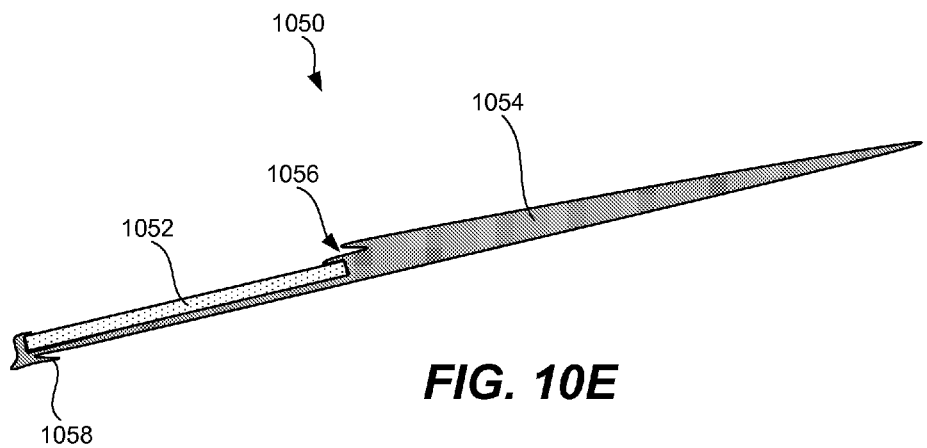
FIG. 10E is a schematic side view of another BIP module, in accordance with certain embodiments.

FIG. 10E is a schematic side view of another BIP module 1050 in accordance with certain embodiments. Module 1050 includes a photovoltaic insert 1052 containing one or more interconnected cells. Photovoltaic insert 1052 may be configured similar to other photovoltaic inserts described in this document. For example, photovoltaic insert 1052 may include one or more CIGS cells interconnected in series with each other. Photovoltaic insert 1052 includes typically include one or more insulating sheets (e.g., glass sheets) protecting the cells from the environment. The insulating sheets may be enclosed into a plastic overmold as shown in FIG. 10E. Various examples of overmold configurations and materials are described elsewhere in this document. Other configurations for supporting photovoltaic insert 1052 with respect to other module's components are possible.

Module 1050 also includes a moisture flap 1054 extending up the roofline from photovoltaic insert 1052. As described above, most of moisture flap 1054 will be positioned under another module after installation of the array. As such, moisture flap 1054 may have though holes and/or may be used for attachment to a building structure. Moisture flap 1054 may form a continuous body with the overmold as shown in FIG. 10E. Moisture flap 1054 may be made from various rigid or semi-rigid materials listed above in order to provide better support to photovoltaic insert 1052. At the interface of moisture flap 1054 and photovoltaic insert 1052, module 1050 includes a channel 1056. Channel 1056 is configured for receiving an extension of another module during installation of an array and for providing mechanical support to this extension with respect to module 1050. Furthermore, during installation, the channel portion of module 1056 is secured with respect to a building structure, e.g., through moisture flap. As such, the extension of the module is also secured with respect to the building structure even though the photovoltaic portion of this module does not have direct attachment to the building structure.

Channel 1056 is an open channel. It may extend along the entire length of the module (i.e., a direction perpendicular to the side view illustrated in FIG. 10E). In other embodiments, it may extend along just a portion of this length similar to a tab-pocket design shown in FIG. 11. An opening of channel 1056 faces down the roof line, which allows water to escape from channel. Water is then directed over the front side of photovoltaic insert 1052, for example. As such, module 1050 is configured to provide electricity and protect the building structure from the environment.

A bottom edge of photovoltaic module 1050 includes an extension 1058 configured for inserting into a channel of another module (like channel 1056 of module 1050). The bottom edge is defined as an edge opposite of moisture flap 1054. At the same time, extension 1058 protrudes up the roof line to fit into the channel opening, which faces down the roof line as explained above. Furthermore, extension 1058 is positioned on the back side of module 1050, such as underneath photovoltaic insert 1052 as shown in FIG. 10E. However, other arrangement and locations of the extension are possible. A combination of channel 1056 and extension 1056 position on module 1050 allows forming a continuous mechanically interconnected array of modules as shown in FIG. 10F and will now be explained in more detail.

Figure 10F:
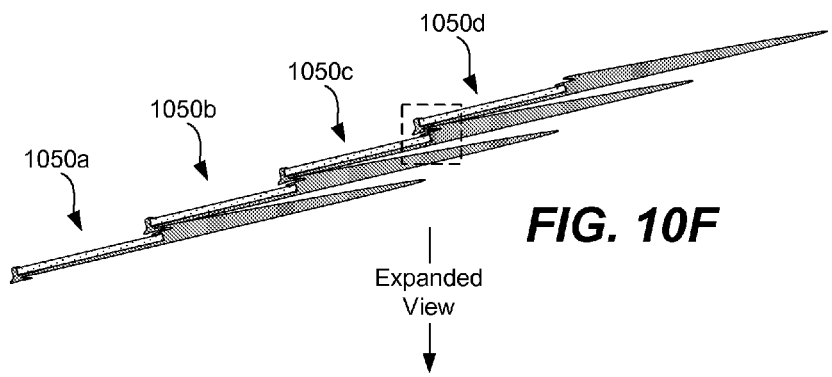
FIG. 10F is a schematic side view of an assembly including four engaged modules, in accordance with certain embodiments.

FIG. 10F is a schematic side view of an assembly including four BIP modules 1050a, 1050b, 1050c, and 1050d in accordance with certain embodiments. The four modules are mechanically interconnected with each other providing a continuous seal to an underlying building structure (not shown) as well as providing some mechanical supports to each other, more specifically, to bottom edges of adjacent modules. For example, modules 1050a, 1050b, 1050c, and 1050d may be connected to the building structure in their moisture flap areas, while their bottom portions corresponding to the photovoltaic inserts are not directly connected. To provide support to their bottom portions, extensions and channels of these modules are engaged. Specifically, an extension of module 1050d is engaged with a channel of module 1050c; an extension of module 1050c is engaged with a channel of module 1050b; an extension of module 1050b is engaged with a channel of module 1050a. This assembly may continue up and/or down the roof line and include any number of modules. These attachments will now be further explained with reference to FIG. 10G.

Figure 10G:
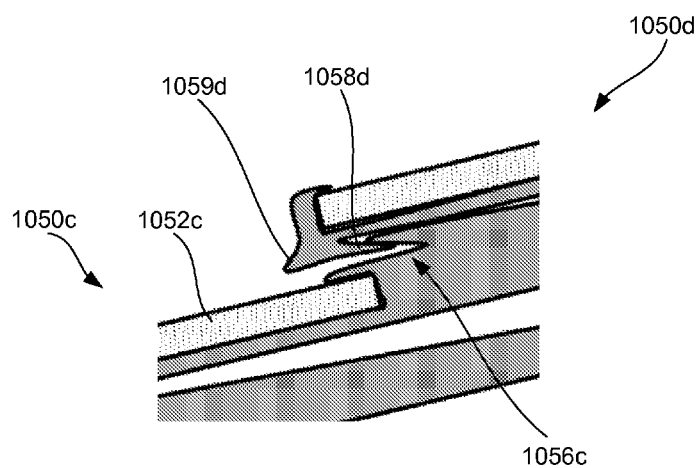
FIG. 10G is an expanded schematic view of an engaged portion of two modules, in accordance with certain embodiments.

FIG. 10G is an expanded schematic view of engaged portions of two modules 1050c and 1050d from the set presented in FIG. 10F. Specifically, this view illustrates extension 1058d of module 1050d engaged with channel 1056c of module 1050c. During installation, extension 1058d is inserted into channel 1056c forming this engagement. This combination of extension 1058d and channel 1056c may include interlocking features similar to the ones described with reference to FIG. 10D, sealing features, and/or bonding features. Furthermore, modules 1050c and 1050d are attached to the building structure (e.g., at their moisture flap areas) and maintain their relative positions, which keeps extension 1058d and channel 1056c engaged. In certain embodiments, some elements of extension 1058d and/or channel 1056c may be made from semi-rigid material that allows some flexibility to these elements and allows separating extension 1058d from channel 1056c, while the respective moisture flap areas are still attached to the building structure. This feature may be used for replacing modules in the installed array (e.g., when one modules breaks). At the same time, these and other elements of extension 1058d and/or channel 1056 should be sufficiently rigid to prevent separation due to gusty winds and/or other environmental factors.

Extension 1058d and channel 1056c may be configured in such a way that module 1050d does not interfere with (e.g., does not shade) the photovoltaic cells in photovoltaic portion 1052c of module 1050c. The bottom edge of module 1050d is shown with a sealing edge 1059d, which may be pressed against the front surface of module 1050c during installation of the array to provide a seal to the engagement. In certain embodiments, sealing edge 1059d is more flexible than extension 1058d.

FIG. 11A is a schematic representation of a photovoltaic assembly including three modules 1102a, 1102b, and 1102c arranged into two rows prior to engaging module 1102a with modules 1102b and 1102c. Modules 1102b and 1102c represent a part of one row, while module 1102a represents a part of an adjacent upper row. The up and down directions (as in "upper row" and "lower row") are defined with respect to the slope of the roof. Module 1102a includes a photovoltaic portion 1104a and a moisture flap 1106a attached to photovoltaic portion 1104a. Photovoltaic portion 1104a includes one or more photovoltaic cells 1108a, various examples and configurations of which are described above. Moisture flap 1106a extends in an upward direction from photovoltaic portion 1104a after installation of module 1102a. Moisture flap 1106a is configured to extend at least under one or two photovoltaic portions of the modules in the upper adjacent row. For example, moisture flaps of modules 1102b and 1102c will extend under at least under photovoltaic portion 1104a of module 1102a after installation. In certain embodiments, these moisture flaps also extend under at least a portion of moisture flap 1106a to ensure that any gap in between two modules is sealed with a moisture flap extending under this gap. Moisture flap 1106a may include edge protrusions 1114a extending in a direction away from a building structure. Edge protrusions 1114a are configured to prevent moisture from escaping the moisture flap area through two side edges of moisture flap 1106a and direct all moisture towards the top surface of the photovoltaic portion 1104a. As described above, the photovoltaic portion 1104a includes a sealing sheet such as a glass panel. The moisture flows over this sheet down the roof.

Module 1102a is shown with four individual tabs 1110a-1, 1110a-2, 1110a-3, and 1110a-4 attached to photovoltaic portion 1104a and extending away from moisture flap 1106a. In general, any number of tabs can be used, e.g., one tab, two tabs, three tabs, four tabs, five tabs, etc. An example with one continuous tab extending along the entire edge of the photovoltaic portion is described above with reference to FIGS. 10B and 10C. Module 1102a is also shown with four individual pocket-channels 1112a. These channels do not extend to side edges of module 1102a (i.e., the edges carrying edge protrusions 1114 in the example shown in FIG. 11A). As such, there is less risk that any water collected in pocket-channels 1112a will migrate to these edges of module 1102a and possibly under module 1102a.

Four individual tabs 1110a-1, 1110a-2, 1110a-3, and 1110a-4 are configured for insertion into corresponding pocket-channels of adjacent modules. As shown in FIG. 11A, tabs 1110a-1, 1110a-2, 1110a-3, and 1110a-4 are aligned for insertion into pocket-channels 1112b-3 and 1112b-4 of module 1102b and pocket channels 1112c-1 and 1112c-2 of module 1102c. Specifically, tab 1110a-1 is aligned with respect to pocket-channel 1112b-3, tab 1110a-2 is aligned with respect to pocket-channel 1112b-4, tab 1110a-3 is aligned with respect to pocket-channel 1112*c*-1, and tab 1110*a*-4 is aligned with respect to pocket-channel 1112*c*-2. One having ordinary skills in the art would understand that other alignment options are possible as well.

FIG. 11B illustrates a schematic expanded view of one tab 1100*a*-2 aligned with respect to pocket-channel 1112*b*-4 prior to engaging tab 1100*a*-2 and pocket-channel 1112*b*-4 or more specifically prior to inserting tab 1100*a*-2 into pocket-channel 1112*b*-4. Pocket-channel 1112*b*-4 is shown with two drain-openings 1120*b* arranged along opposite side edges of the channel, which is illustrated in more detail in FIG. 11D corresponding to a cross-section "B-B" shown with a dotted line in FIG. 11B. Pocket-channel 1112*b*-4 is also shown to have a lip 1122*b* partially extending along the pocket-channel in between two drain-openings 1120*b*. Lip 1122*b* forms an open cavity 1124*b* (as shown in FIG. 11C), which is configured for receiving a portion of tab 1110*a*-2. The tabs may be made from a semi-rigid material that is capable of bending to conform to the shape of the pocket-channels and open-cavities during insertion. The tabs and lips may include interlocking features similar to the ones described with reference to FIG. 10D. As shown in FIG. 11D, drain-openings 1120*b* allow water to escape from open cavity 1124*b*. In certain embodiments, the bottom of the open cavity may be sloped towards the drain openings.

Figure 12:
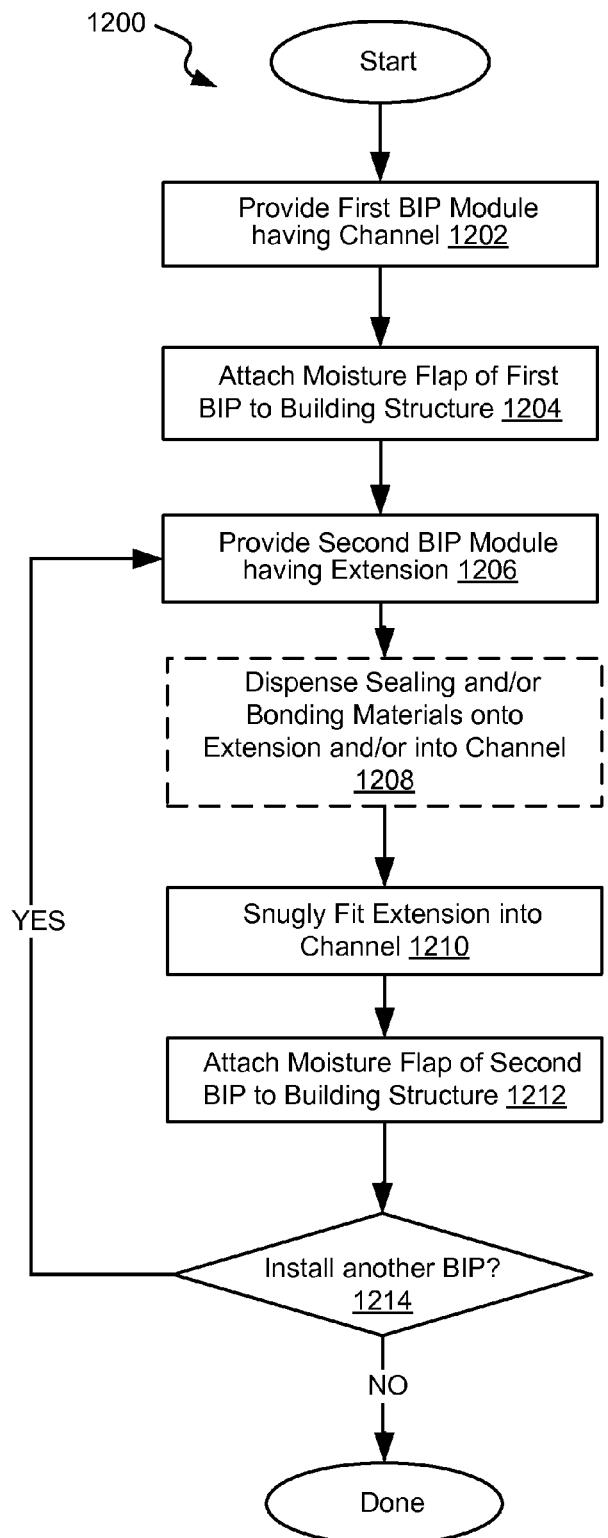
FIG. 12 is a process flowchart corresponding to a method of installing a BIP array, in accordance with certain embodiments.

FIG. 12 is a flowchart corresponding to a process 1200 of installing a building integrable photovoltaic (BIP) array of BIP modules on a building structure in accordance with certain embodiments. Process 1200 may start with an operation 1202 that involves providing a first BIP module having an insert and a channel provided on one edge of the insert. Various examples of BIP modules are described above. The module provided in this operation may also have an extension, which may be already interconnected to another module.

Process 1200 may proceed with attaching a moisture flap of the provided module to the building structure in an operation 1204. For example, a moisture flap may be nailed, screwed, glued, or mechanically attached using other suitable technique to the building structure. In certain embodiments, a provided module does not have a moisture flap and other components of the module positioned near the channel edge are attached to the building structure.

At some point during installation process 1200, another BIP module is provided (block 1206). This second module has an insert and an extension provided on one edge of the insert. This module may also have a channel provided on the opposite edge of the insert for interconnection with additional modules. In general, the first module provided in operation 1202 and the second module provided in operation 1206 may have the same design.

In certain embodiments, a sealing material and/or an adhesive material is dispensed into the channel of the first module or onto the extension of the second module in an optional operation 1208. Some examples of such materials include Dow Corning in Midland, Mich.: silicone adhesives (part numbers 3-1595 and 3-1595HP), thixotropic adhesive (part number 3-6265), silane and siloxane based adhesives (part number 4-8012), primer-less silicone adhesive (part number 866), heat cured one part adhesive (part number SE1771), thixotropic fast low temperature cure adhesive (part number EA-6054), two part translucent heat cure adhesive (part number SE 1700), Sylgard® 577 primer-less silicone adhesive, PV-804 Neutral Sealant, and two-part controlled-volatility (CV) grade adhesive (part number SE 1720).

Process 1200 may proceed with snuggly fitting the extension of the second module into the channel of the first module in operation 1210. This operation mechanically interconnects the two modules, such that the extension edge of the second module can not be lifted up with respect to the first module. If the first module has been previously attached to the building structure (e.g., in operation 1204), then the extension edge of the second module is now secured with respect to the building structure as well. At the same time, the opposite edge of the second module remains unsecured.

In operation 1210, at least a portion of the second module may be positioned over a moisture flap of the first module. For example, a moisture flap may have through-holes made during attachment of the moisture flap to the building structure in operation 1204. Positioning the second module over this moisture flap may help to further isolate these though holes from moisture.

In certain embodiments, an extension of the second module and a channel of the first module may have interlocking features. In these embodiments, snuggly fitting the extension into the channel also involves interlocking the two modules. The modules may be interlocked in various directions. For example, the modules may be interlocked to prevent the extension from sliding out of the channel. In the same or another embodiment, the modules may be interlocked to prevent the extension from sliding within the channel in a direction parallel to the channel's length.

A moisture flap of the second module may be then attached to the building structure in operation 1212. This operation may be similar to operation 1204 described above. In certain embodiments, the moisture flap of the second module is attached to the building structure before snuggly fitting the extension into the channel with operation 1212 performed before operation 1210. After completing operations 1210 and 1212, the second module may not be lifted up with respect to the building structure.

Some operations (e.g., operations 1204, 1206, 1208, 1210, and 1212) may be repeated for additional modules (block 1214). For example, a third module may be provided. This module may include an insert and a third extension provided on the edge of the insert. This third extension is then fit snugly into a channel of the second module. After this fitting, the third extension can not be lifted up with respect to the second module. A moisture flap of the third module may be attached to the building structure.

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

What is claimed is:

1. A building-integrable photovoltaic module comprising:
   a top flap portion;
   an exposure portion, the exposure portion including an extension portion along an edge of the exposure portion opposite the top flap portion;
   a photovoltaic insert comprising one or more photovoltaic cells, a first edge, and a second edge, the first edge of the photovoltaic insert opposite the second edge, the photovoltaic insert located substantially within the exposure portion, the first edge located closer to the top flap portion than the second edge, and the second edge located closer to the extension portion than the first edge; and
   a channel located substantially between the top flap portion and the exposure portion, wherein the top flap portion is configured to extend under at least a portion of a photovoltaic insert of a second adjacent building-integrable photovoltaic module and the extension portion is configured to fit into a corresponding channel of an adjacent building-integrable photovoltaic module during installation and to prevent lifting of the exposure portion of the building-integrable photovoltaic module away from the top flap portion of the adjacent building-integrable photovoltaic module after the installation.

2. The building-integrable photovoltaic module of claim 1, wherein the extension portion is configured to form a moisture-tight seal with the corresponding channel of the adjacent building-integrable photovoltaic module.

3. The building-integrable photovoltaic module of claim 1, wherein the extension portion is configured to interlock with the corresponding channel of the adjacent building-integrable photovoltaic module to mechanically resist relative translational movement of the building-integrable photovoltaic module and the adjacent building-integrable photovoltaic module in at least two orthogonal directions perpendicular to the first edge.

4. The building-integrable photovoltaic module of claim 1, wherein interlock of the extension portion with the corresponding channel of the adjacent building-integrable photovoltaic module prevents the extension portion from sliding out of the corresponding channel of the adjacent building-integrable photovoltaic module.

5. The building-integrable photovoltaic module of claim 1, further comprising a top protrusion located near the second edge of the photovoltaic insert and configured to be positioned over the corresponding channel of the adjacent building-integrable photovoltaic module to prevent water flowing across the exposure portion of the building-integrable photovoltaic module and towards a corresponding exposure portion of the adjacent building-integrable photovoltaic module from getting into the corresponding channel.

6. The building-integrable photovoltaic module of claim 1, wherein the top flap portion is configured to prevent water from penetrating in between the building-integrable photovoltaic module and the second adjacent building-integrable photovoltaic module.

7. The building-integrable photovoltaic module of claim 6, wherein the channel is located on the top flap portion.

8. The building-integrable photovoltaic module of claim 7, wherein the channel does not extend to side edges of the top flap portion.

9. The building-integrable photovoltaic module of claim 1, further comprising one or more seals positioned inside the channel and/or on an edge of the extension portion.

10. The building-integrable photovoltaic module of claim 1, wherein a portion of the extension portion configured to interface with the corresponding channel of the adjacent building-integrable photovoltaic module is between about 5 millimeters and about 20 millimeters wide.

11. The building-integrable photovoltaic module of claim 1, wherein the channel is a pocket-channel that does not extend to side edges of the building-integrable photovoltaic module.

12. The building-integrable photovoltaic module of claim 11, wherein the pocket-channel comprises one or more drain-openings.

13. The building-integrable photovoltaic module of claim 11, wherein the one or more drain-openings are disposed along side edges of the pocket-channel.

14. The building-integrable photovoltaic module of claim 1, wherein the exposure portion includes multiple extension portions provided along the edge of the exposure portion opposite the single flap portion, the multiple extension portions including the extension portion and configured to fit into multiple corresponding channels of at least two adjacent building-integrable photovoltaic modules during installation.

15. The building-integrable photovoltaic module of claim 1, wherein the channel comprises an opening facing away from the second edge.

16. The building-integrable photovoltaic module of claim 1, wherein the channel comprises an opening facing towards the second edge and the extension portion extends towards the first edge.

17. A method for installing an array of building-integrable photovoltaic modules on a building structure, the method comprising:
    providing a first building-integrable photovoltaic module and a second building-integrable photovoltaic module, each of the building-integrable photovoltaic modules having a top flap portion, an exposure portion, a channel, and a photovoltaic insert comprising one or more photovoltaic cells and having a first edge and a second edge opposite the first edge, the exposure portion including an extension portion along an edge of the exposure portion opposite the top flap portion, the photovoltaic insert located substantially within the exposure portion, the first edge located closer to the top flap portion than the second edge, the second edge located closer to the extension portion than the first edge, and the channel located substantially between the top flap portion and the exposure portion;
    attaching the top flap portion of the second building-integrable photovoltaic module to the building structure; and
    fitting the extension portion of the second building-integrable photovoltaic module into the channel of the first building-integrable photovoltaic module, wherein after the fitting the exposure portion of the second building-integrable photovoltaic module is substantially prevented from being lifted up with respect to the first building-integrable photovoltaic module through engagement of the extension portion of the second building-integrable photovoltaic module with the channel of the first building-integrable photovoltaic module.

18. The method of claim 17, further comprising attaching the top flap portion of the first building-integrable photovoltaic module to the building structure, and wherein at least a portion of the second building-integrable photovoltaic module is positioned over the top flap portion of the first building-integrable photovoltaic module.

19. The method of claim 17, wherein fitting the extension portion of the second building-integrable photovoltaic module into the channel of the first building-integrable photovoltaic module comprises interlocking the second building-integrable photovoltaic module and the first building-integrable photovoltaic module.

20. The method of claim 17, further comprising, prior to fitting the extension portion of the second building-integrable photovoltaic module into the channel of the first building-integrable photovoltaic module, dispensing a sealing material and/or a bonding material onto the extension portion of the second building-integrable photovoltaic module and/or into the channel of the first building-integrable photovoltaic module.

21. The method of claim 17, wherein attaching the top flap portion of the second building-integrable photovoltaic module to the building structure is performed after fitting the extension portion of the second building-integrable photovoltaic module into the channel of the first building-integrable photovoltaic module.

22. The method of claim 21, wherein after attaching the top flap portion of the second building-integrable photovoltaic module to the building structure and after fitting the extension of the second building-integrable photovoltaic module into the channel of the first building-integrable photovoltaic module, the second building-integrable photovoltaic module is mechanically secured with respect to the building structure.

23. The method of claim 17, further comprising:
providing a third building-integrable photovoltaic module, the third building-integrable photovoltaic module also having a top flap portion, an exposure portion, a channel, and a photovoltaic insert comprising one or more photovoltaic cells and having a first edge and a second edge opposite the first edge, the exposure portion including an extension portion along an edge of the exposure portion opposite the top flap portion, the photovoltaic insert located substantially within the exposure portion, the first edge located closer to the top flap portion than the second edge, the second edge located closer to the extension portion than the first edge, and the channel located substantially between the top flap portion and the exposure portion; and
further fitting the extension portion of the third building-integrable photovoltaic module into the channel of the second building-integrable photovoltaic module, wherein after the further fitting the exposure portion of the third building-integrable photovoltaic module is prevented from being lifted up with respect to the second building-integrable photovoltaic module through engagement of the extension portion of the third building-integrable photovoltaic module with the channel of the second building-integrable photovoltaic module.

24. A building-integrable photovoltaic module comprising:
a top flap portion;
an exposure portion, the exposure portion including an extension portion along an edge of the exposure portion opposite the top flap portion;
a photovoltaic insert comprising one or more photovoltaic cells, a first edge, and a second edge, the first edge of the photovoltaic insert opposite the second edge, the photovoltaic insert located substantially within the exposure portion, the first edge located closer to the top flap portion than the second edge, and the second edge located closer to the extension portion than the first edge; and
a channel located substantially between the top flap portion and the exposure portion, wherein the channel comprises one or more drain openings to allow water to escape from the channel and the extension portion is configured to fit into a corresponding channel of an adjacent building-integrable photovoltaic module during installation and to prevent lifting of the exposure portion of the building-integrable photovoltaic module away from the top flap portion of the adjacent building-integrable photovoltaic module after the installation.

* * * * *